United States Patent
Loparco et al.

(10) Patent No.: US 7,540,757 B2
(45) Date of Patent: Jun. 2, 2009

(54) FAIL-SAFE LOCKOUT FOR BLIND MATE CARD

(75) Inventors: John J. Loparco, Poughkeepsie, NY (US); Michael T. Peets, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 11/852,573

(22) Filed: Sep. 10, 2007

(65) Prior Publication Data

US 2009/0068859 A1 Mar. 12, 2009

(51) Int. Cl.
H01R 13/64 (2006.01)
(52) U.S. Cl. ...................................... 439/374
(58) Field of Classification Search .................. 439/374, 439/375, 8, 64, 59, 79, 395, 396
See application file for complete search history.

(56) References Cited

U.S. PATENT DOCUMENTS

| | | | | |
|---|---|---|---|---|
| 4,350,401 A | * | 9/1982 | Allen et al. | 439/374 |
| 6,109,934 A | * | 8/2000 | Madsen et al. | 439/79 |
| 6,149,465 A | * | 11/2000 | Berg et al. | 439/630 |
| 6,648,693 B1 | * | 11/2003 | Hogan et al. | 439/630 |
| 7,402,053 B2 | * | 7/2008 | Hougham et al. | 439/70 |
| 7,410,383 B2 | * | 8/2008 | Hsieh | 439/374 |
| 2007/0178725 A1 | * | 8/2007 | Tsuruzawa et al. | 439/79 |

* cited by examiner

*Primary Examiner*—Chandrika Prasad
(74) *Attorney, Agent, or Firm*—Cantor Colburn LLP; Lily Neff

(57) ABSTRACT

A lockout mechanism for a card assembly having a blind connection to an electronic component includes a card disposed in a housing and articulable in the housing in a direction substantially perpendicular to a direction of insertion of the card assembly into the electronic component, the card including a connector having connection fingers extending substantially in said direction. A lockout is disposed in the housing, the lockout movable in a direction perpendicular to the card between a first or locked position and a second or unlocked position, and preventing articulation of the card unless the one or more connection fingers are aligned with one or more corresponding component fingers in the electronic component. An alignment feature is included, that when brought into contact with a corresponding portion of the electronic component ensures proper alignment between the one or more connection fingers and one or more corresponding component fingers.

9 Claims, 2 Drawing Sheets

FAIL-SAFE LOCKOUT FOR BLIND MATE CARD

BACKGROUND OF THE INVENTION

1. Field of the Invention

This invention relates to electronic components, and particularly to blind connections of cards in electronic components.

2. Description of Background

Electronic components often contain one or more cards which perform various functions in the electronic component. The cards are electrically connected to other portions of the electronic component by a direct connection and/or a blind connection. A blind connection is one where two separate actions are required to plug the card assembly. First the card assembly is inserted into the system and then some type of mechanism is actuated to plug the card perpendicular to the direction of insertion. To properly accomplish the blind connection, the connector features on the card must be properly aligned with corresponding connector features on the electronic component prior to articulating the card. Misalignment of the connection features can cause the connection features of the card and/or the electronic component to be damaged, thus requiring costly and time consuming replacement.

SUMMARY OF THE INVENTION

The shortcomings of the prior art are overcome and additional advantages are provided through the provision of a lockout mechanism for a card assembly having a blind connection to an electronic component. The lockout mechanism includes a card disposed in a housing and articulable in the housing in a direction substantially perpendicular to a direction of insertion of the card assembly into the electronic component, the card including a connector having connection fingers extending substantially in said direction. A lockout is disposed in the housing, the lockout movable in a direction perpendicular to the card between a first or locked position and a second or unlocked position, and preventing articulation of the card unless the one or more connection fingers are aligned with one or more corresponding component fingers in the electronic component. The mechanism further includes an alignment feature, that when brought into contact with a corresponding portion of the electronic component ensures proper alignment between the one or more connection fingers and one or more corresponding component fingers.

A method of assembling a card having a blind connection to an electronic component includes inserting the card assembly into the electronic component in a first direction, the card assembly including the lockout mechanism. The one or more connection fingers are aligned to one or more corresponding component fingers in the electronic component by contacting the alignment feature with the corresponding portion of the electronic component, the lockout is moved from the first position to the second position, and the card is articulated in the second direction thereby completing an electrical connection between the one or more connection fingers and the one or more component fingers.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which ensures proper alignment of connection features in a blind connection, thus reducing damage to connection features and reducing necessity for repair of blind connections.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
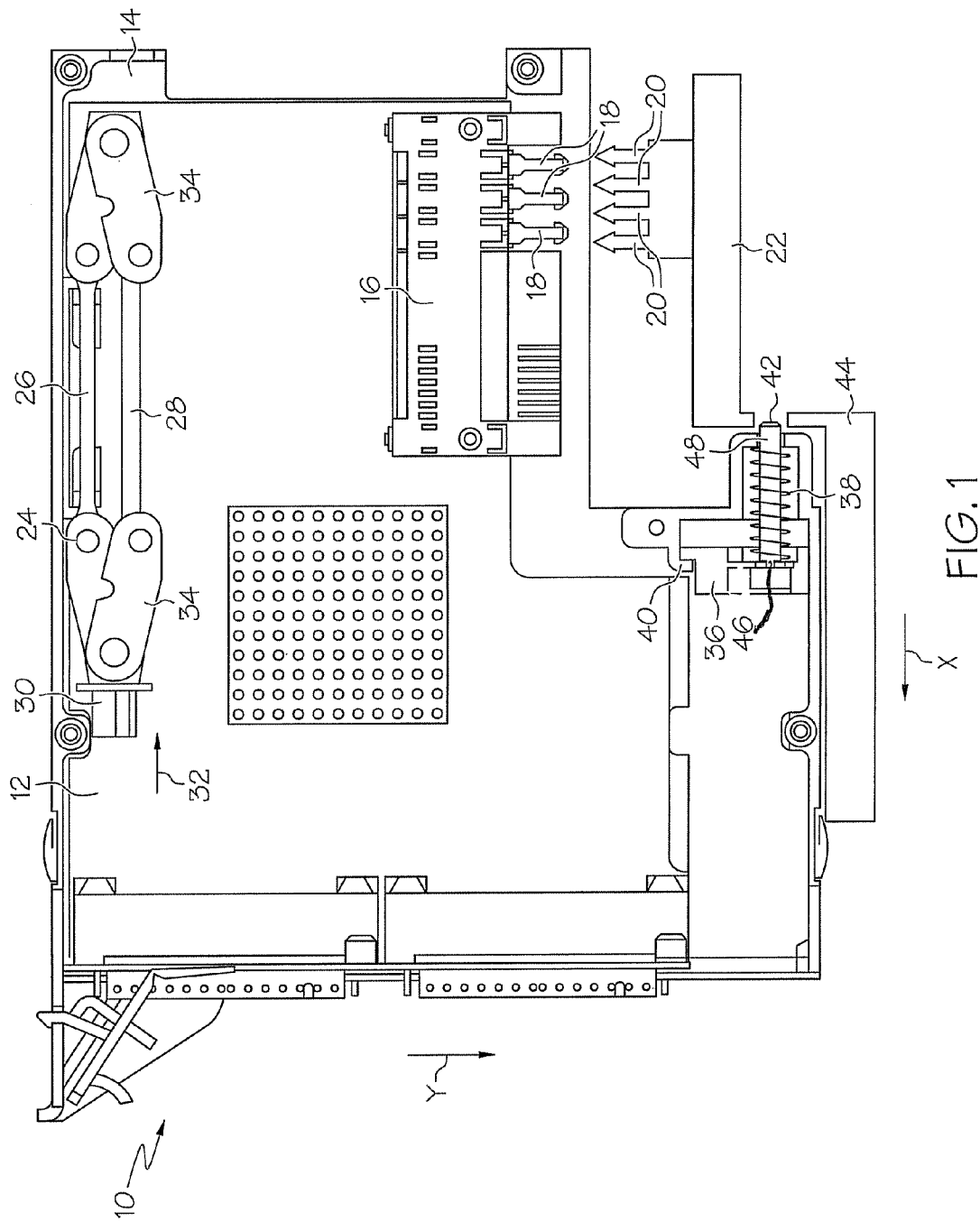
FIG. 1 is a cross-sectional view of one example of a card assembly including a fail safe lockout.

Turning now to the drawings in greater detail, it will be seen that in FIG. 1 there is a card assembly 10 for an electronic component. The card assembly 10 includes a card 12 disposed in a housing 14. In FIG. 1, a top portion of the housing 14 has been removed so the elements of the card assembly 10 can be better shown. A blind connector 16 is in electrical communication with the card 12, and in the embodiment of FIG. 1, includes a plurality of connection fingers 18 which are receivable in corresponding component fingers 20 to complete an electrical connection of the card assembly 10 to an electronic component 22. To articulate the card 12 and complete the electrical connection, a scissors 24 is disposed in the card assembly 10. A first leg 26 is affixed to the housing 14 and a second leg 28 is affixed to the card 12. When a nut 30 is advanced in a direction shown by arrow 32, scissors arms 34 spread, causing the second leg 28 and card 12 to move downwardly.

The card assembly 10 further includes a lockout 36. The lockout 36 acts as a physical stop to prevent the card 12 from being moved downwardly unless the card assembly 12 is properly located in the electronic component 22 such that the connection fingers 18 align with the component fingers 20. To ensure proper alignment between the connection fingers 18 and the component fingers 20, the housing 14 is brought into contact with a stiffener 44 of the electronic component 22. By design, this contact ensures that the connection fingers 18 align with the component fingers 20.

In the embodiment of FIG. 1, a spring 38 is disposed between the housing 14 and the lockout 36, which biases the lockout 36 in the direction "X" in FIG. 1 into the path of the card 12 (i.e. the direction "Y" in FIG. 1). In some embodiments the housing 14 includes a housing tab 40. The spring 38 pushes the lockout 36 into contact with the housing tab 40, maintaining the lockout 36 in a $1^{st}$ or locked position.

Once the proper alignment is achieved by seating the housing 14 against the stiffener 44, the lockout 36 may be disengaged. In one embodiment, to enable disengagement of the lockout 36, a screw 42 or other threaded or unthreaded fastener is utilized to secure the card assembly 10 to the stiffener 44. In the embodiment of FIG. 1, the screw 42 is inserted through a lockout hole 46, through the center of spring 38, and through a housing hole 48.

Figure 2:
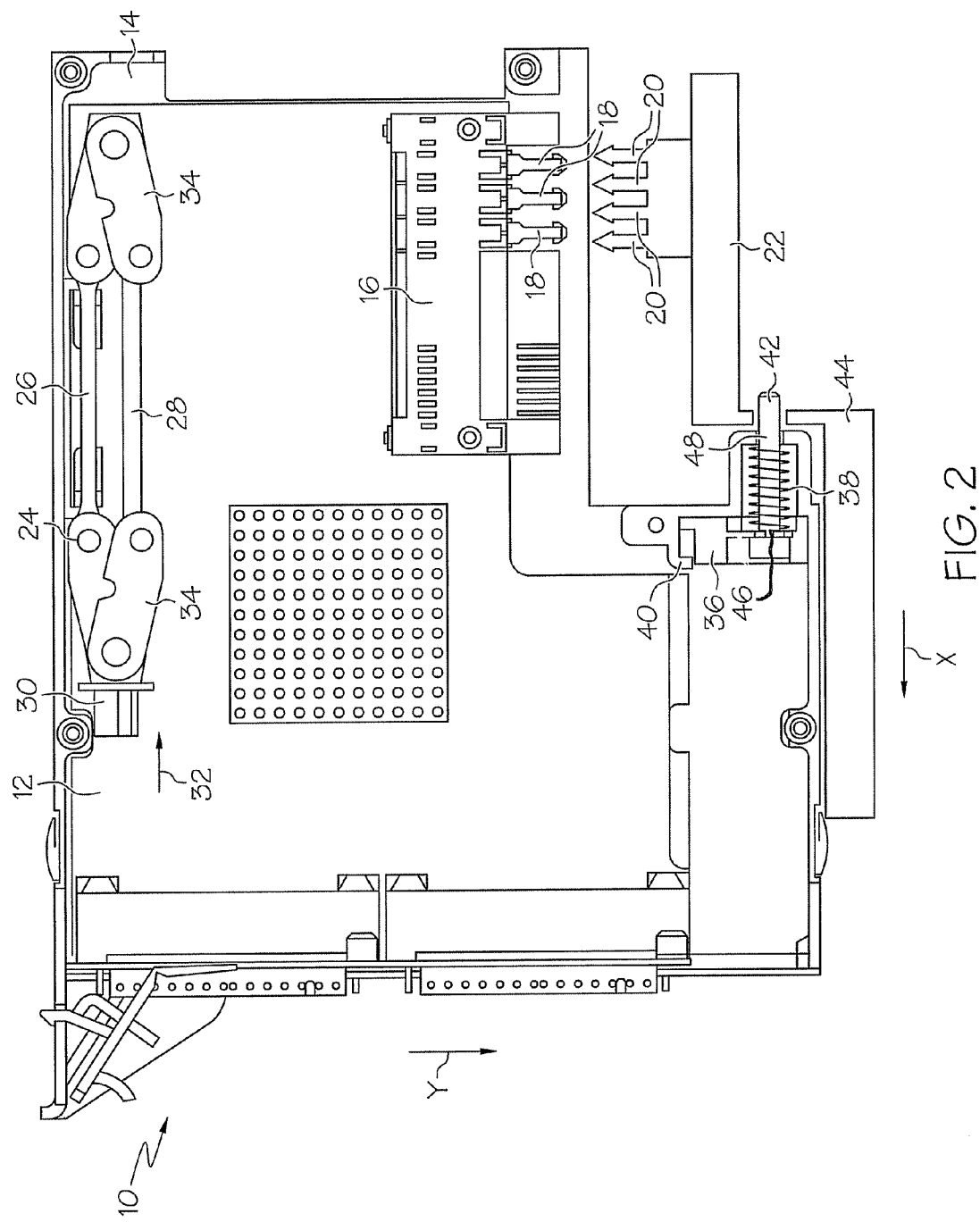
FIG. 2 is a cross-sectional view of the card assembly of FIG. 1 showing the lockout in an unlocked position.

As shown in FIG. 2, screw 42 is advanced through stiffener 44. As the screw 42 advances, the force of spring 38 is overcome, and lockout 36 moves out of the path of card 12 to a $2^{nd}$ or unlocked position. The screw 42 urges the housing 14 and the stiffener 44 together, thus maintaining the proper alignment between the card assembly 10 in the electronic component 22. The scissors 34 can then be expanded to articulate the card 12 and move the connection fingers 18 toward the component fingers 20 in the Y direction, thus completing the electrical connection of the card assembly 10 to the electronic component 22.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A lockout mechanism for a card assembly having a blind connection to an electronic component comprising:
   - a card disposed in a housing and articulable in the housing in an articulation direction substantially perpendicular to a direction of insertion of the card assembly into the electronic component, the card including a connector having connection fingers extending substantially in said articulation direction;
   - a lockout disposed in the housing, the lockout movable in a direction perpendicular to the articulation direction between a first or locked position and a second or unlocked position, the lockout preventing articulation of the card unless the one or more connection fingers are aligned with one or more corresponding component fingers in the electronic component; and
   - an alignment feature, that when brought into contact with a corresponding portion of the electronic component ensures proper alignment between the one or more connection fingers and one or more corresponding component fingers.

2. The card assembly of claim 1 further comprising a spring configured to bias the lockout to the first position.

3. The card assembly of claim 2 further comprising at least one fastener utilized to overcome the bias of the spring and urge the lockout to the second position.

4. The card assembly of claim 3 wherein the at least one fastener is at least one threaded fastener.

5. The card assembly of claim 1 wherein the alignment feature is at least one face of the housing brought into contact with at least one stiffener of the electronic component.

6. A method of assembling a card having a blind connection to an electronic component comprising:
   - inserting the card assembly into the electronic component in a first direction, the card assembly including:
   - a card disposed in a housing and articulable in the housing in a second direction substantially perpendicular to the first direction, the card including a connector having connection fingers extending substantially in said second direction;
   - a lockout disposed in the housing, the lockout movable in a direction perpendicular to the second direction between a first or locked position and a second or unlocked position, the lockout preventing articulation of the card unless the one or more connection fingers are aligned with one or more corresponding component fingers in the electronic component; and
   - an alignment feature, that when brought into contact with a corresponding portion of the electronic component ensures proper alignment between the one or more connection fingers and one or more corresponding component fingers;
   - aligning the one or more connection fingers to one or more corresponding component fingers in the electronic component by contacting the alignment feature with the corresponding portion of the electronic component;
   - moving the lockout from the first position to the second position; and
   - articulating the card in the second direction thereby completing an electrical connection between the one or more connection fingers and the one or more component fingers.

7. The method of claim 6 wherein card assembly further comprises a spring configured to bias the lockout to the first position.

8. The method of claim 7 wherein disengaging the lockout comprises advancing a fastener to overcome the bias of the spring and urge the lockout to the second position.

9. The method of claim 7 wherein the at least one fastener is at least one threaded fastener.

* * * * *